US 8,709,858 B2

(12) United States Patent
Stuetzel et al.

(10) Patent No.: US 8,709,858 B2
(45) Date of Patent: Apr. 29, 2014

(54) TAILORING THE BAND GAP OF SOLAR CELLS MADE OF LIQUID SILANE BY ADDING GERMANIUM

(75) Inventors: Bernhard Stuetzel, Marl (DE); Wolfgang Fahrner, Gundelfingen (DE)

(73) Assignee: Evonik Degussa GmbH, Essen (DE)

( * ) Notice: Subject to any disclaimer, the term of this patent is extended or adjusted under 35 U.S.C. 154(b) by 0 days.

(21) Appl. No.: 13/265,417

(22) PCT Filed: Apr. 28, 2010

(86) PCT No.: PCT/EP2010/055665
§ 371 (c)(1),
(2), (4) Date: Oct. 20, 2011

(87) PCT Pub. No.: WO2010/125081
PCT Pub. Date: Nov. 4, 2010

(65) Prior Publication Data
US 2012/0042951 A1    Feb. 23, 2012

(30) Foreign Application Priority Data
Apr. 30, 2009 (DE) .......................... 10 2009 002 758

(51) Int. Cl.
*H01L 31/028* (2006.01)
(52) U.S. Cl.
USPC ............. 438/93; 438/502; 438/468; 438/488; 257/52; 257/432; 257/E21.091; 257/E21.114; 257/E21.115; 428/447; 430/2; 427/475
(58) Field of Classification Search
USPC ............ 257/79, 82, 441, 414; 438/93, 73, 69, 438/22; 118/666, 715; 427/255.27
See application file for complete search history.

(56) References Cited

U.S. PATENT DOCUMENTS

| 7,585,752 | B2 * | 9/2009 | Todd et al. ............... 438/488 |
| 2005/0008880 | A1 | 1/2005 | Kunze et al. |
| 2005/0142046 | A1 * | 6/2005 | Todd ....................... 422/186.04 |
| 2006/0154036 | A1 | 7/2006 | Kunze et al. |
| 2006/0157677 | A1 | 7/2006 | Kunze et al. |
| 2008/0138718 | A1 * | 6/2008 | Hayase et al. ............... 430/2 |
| 2008/0138966 | A1 | 6/2008 | Rogojina et al. |

(Continued)

FOREIGN PATENT DOCUMENTS

| JP | 9-237927 | 9/1997 |
| JP | 2005-51222 | 2/2005 |

(Continued)

OTHER PUBLICATIONS

U.S. Appl. No. 13/498,206, filed Mar. 26, 2012, Brausch, et al.

(Continued)

*Primary Examiner* — Jerome Jackson, Jr.
*Assistant Examiner* — Bo Fan
(74) *Attorney, Agent, or Firm* — Oblon, Spivak, McClelland, Maier & Neustadt, L.L.P.

(57) ABSTRACT

The present invention relates to a method for decreasing or increasing the band gap shift in the production of photovoltaic devices by means of coating a substrate with a formulation containing a silicon compound, e.g., in the production of a solar cell comprising a step in which a substrate is coated with a liquid-silane formulation, the invention being characterized in that the formulation also contains at least one germanium compound. The invention further relates to the method for producing such a photovoltaic device.

22 Claims, 2 Drawing Sheets

(56) References Cited

U.S. PATENT DOCUMENTS

Figure 1:
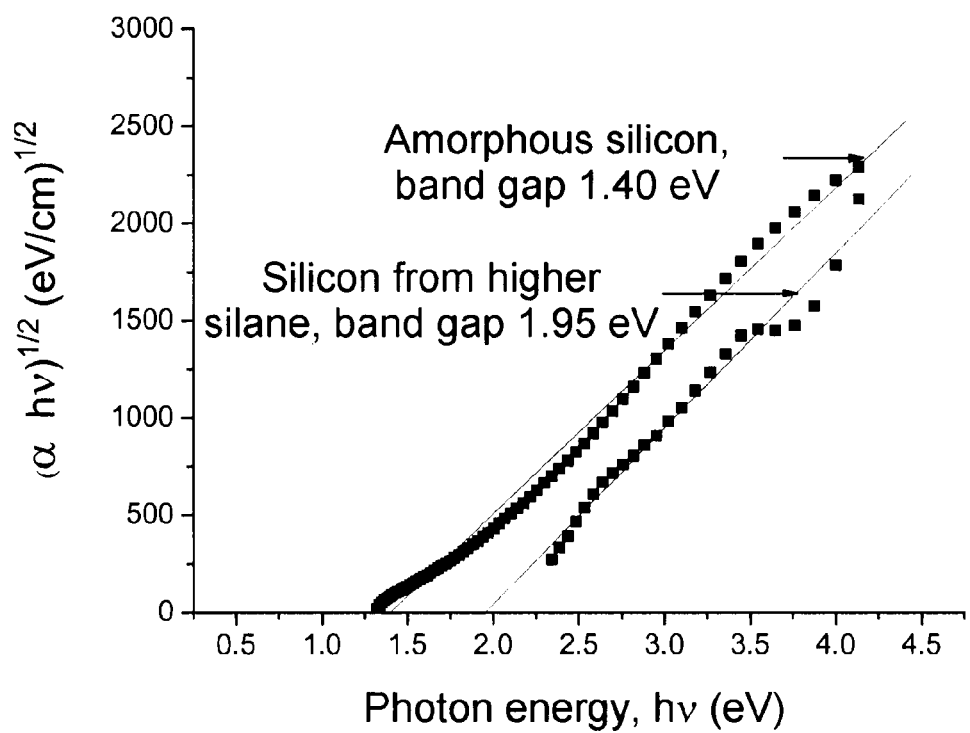

| | | |
|---|---|---|
| 2009/0053536 A1 | 2/2009 | Kunze et al. |
| 2009/0065776 A1* | 3/2009 | Scher et al. .................. 257/52 |
| 2011/0104877 A1 | 5/2011 | Kunze et al. |
| 2011/0189072 A1 | 8/2011 | Brausch et al. |
| 2011/0268642 A1 | 11/2011 | Brausch et al. |
| 2012/0199832 A1 | 8/2012 | Stuetzel et al. |
| 2012/0205654 A1 | 8/2012 | Stuetzel et al. |
| 2012/0214005 A1 | 8/2012 | Wieber et al. |

FOREIGN PATENT DOCUMENTS

| | | |
|---|---|---|
| JP | 2009-511670 | 3/2009 |
| WO | 2007 044429 | 4/2007 |
| WO | 2008/045327 | 4/2008 |

OTHER PUBLICATIONS

U.S. Appl. No. 13/510,373, filed Jul. 12, 2012, Wieber, et al.

U.S. Appl. No. 13/574,376, filed Jul. 20, 2012, Wieber, et al.

International Search Report issued Jun. 15, 2011 in PCT/EP10/055665 filed Apr. 28, 2010.

Meaudre, M. et al. "Deep Defects and their Electron-Capture Cross Sections in Polymorphous Silicon-Germanium Thin Films", Journal of Applied Physics, vol. 98, No. 3, pp. 033531-1-033531-7, XP 012078243 (Aug. 12, 2005).

U.S. Appl. No. 13/807,852, filed Dec. 31, 2012, Stuetzel, et al.

Japanese Office Action issued Jan. 14, 2014 in connection with corresponding Japanese Patent Application No. 2012-507719, filed Apr. 28, 2010.

* cited by examiner

TAILORING THE BAND GAP OF SOLAR CELLS MADE OF LIQUID SILANE BY ADDING GERMANIUM

The invention relates to a process for reducing or eliminating the band gap shift in the production of photovoltaic systems by means of coating of a substrate with a formulation comprising a silicon compound, for example in the production of a solar cell, comprising a step in which a substrate is coated with a liquid silane formulation. The invention also relates to the production process for such a photovoltaic system.

The conventional production of solar cells consists in the opposite doping of a doped semiconductor substrate by means of implantation or diffusion, or deposition of an oppositely doped semiconductor layer on a doped semiconductor substrate by means of epitaxy, or in the deposition of semiconductor layers of different doping from the gas phase under reduced pressure, or of variants of the processes mentioned. The disadvantage of all these processes is the economic investment and costs which are thus necessary.

To avoid the need for vacuum technology, high temperatures and/or an expensive substrate, attempts are being made to produce layers or layer sequences from silanes in liquid phase.

By depositing one or more layers of these silanes on a suitable substrate, it is possible to obtain a p-n junction which acts as a solar cell. The deposition is effected by means of a spin-coater. The layers formed are stabilized by a suitable thermal treatment, such that they typically assume a mixture of microcrystalline, nanocrystalline and amorphous (polymorphic for short) structures. Unless stated explicitly, all microcrystalline, nanocrystalline and/or amorphous layers shall generally be referred to here as "polymorphic", since an exact distinction and definition is not possible with accuracy in most cases, or is of minor importance for the result achieved.

The way in which silicon layers are produced from silanes is known per se. For instance, GB 2077710 teaches the preparation of polysilanes of the general formula—$(SiH_2)_n$—where $n \geq 10$ by simultaneous reduction and polymerization of $SiH_2Cl_2$ with alkali metals. Such higher silanes are named as a precursor for silicon layers, for example for solar cells. In the case of the silanes $Si_nH_{2n+2}$ with relatively small values for n, namely $n \leq 4$, JP 7267621 teaches the production of silicon layers from films of such silanes, which are first irradiated with UV at low temperatures, and are then heated to temperatures above 400° C. In addition, EP 1284306 teaches that silicon films can be produced in a similar manner from cyclic silanes of the general formula $Si_nH_{2n}$ and open-chain silanes of the general formula $Si_nH_{2n+2}$, in each case where n=3 to 10. These silanes are partly or wholly oligomerized, for example by heating and/or UV irradiation. In addition, specific phosphorus compounds or boron compounds are added in order to achieve n- or p-doping.

The thin layers produced according to the prior art exhibit an optoelectronic property which is referred to as a blue shift and is known from other measurement objects studied. As soon as characteristic parameters—in the present case the diameter of the silicon particles—have values in the nanometer range, the optical parameters shift into the blue. The absorption of photons by the silicon layers formed does not commence until the blue, while the absorption in the other spectral regions of the sun is considerably lower than for conventional monocrystalline silicon. It is known from the literature that solar cells have a maximum efficiency when the material used has a band gap of 1.1 to 1.5 eV. An increase in the band gap to, for example, 1.95 eV means, in technical terms, a reduction in the achievable efficiency to approx. 71% in the case of one-sun illumination and to 57% in the case of a concentrator illumination of 1000 suns (Goetzberger, A. et al.: Crystalline Silicon Solar Cells, Wiley, New York, p. 186 (1994)]. The evidence for the increased band gap (from 1.4 eV for amorphous silicon to 1.95 eV for polymorphic silicon) can be seen in FIG. 1. The band gap is determined with a spectral ellipsometer (J. A. Woollam Co., Inc., WVASE32™ model). The wavelength-dependent absorbance (among other parameters) is measured and converted to the absorption coefficient. In addition, the root of the product of absorption coefficient and photon energy is plotted against the photon energy (Tauc plot). The point of intersection of the linear region of this curve with the energy axis gives the band gap. One example of this measurement can be seen in FIG. 1.

The method of adding germanium to multicrystalline crucible-pulled silicon to improve the electrical and optical properties thereof is known from other patents. In US 2007/0006915, multicrystalline silicon-germanium alloys are produced by the casting method in a crucible. The process is energy-intensive and requires a high level of apparatus complexity. The authors consider advantages to be improvements in electrical properties and in the quantum yield in the case of solar cells. The reference product used is multicrystalline silicon, which already has an optimal band gap of approx. 1.1 eV. Addition of germanium results in a change in the band gap to smaller values, such that the light yield is improved by an increased absorption in the red spectral region.

It was thus an object of the present invention, in the case of solar cells based on a sequence of thin polymorphic silicon layers which have been produced by means of spin-on deposition or a similar method, to avoid, to remedy or to compensate for the disadvantage of the relatively low energy yield of the incident sunlight due to the great shift in band gap, without needing to do without the cost and process advantages which—in contrast to the solar cells on a single-crystal basis—are associated with the alternatively produced solar cells based on thin polymorphic silicon layers. The cost and process advantages also exist compared to the thin layer methods in complex vacuum chambers, known as CVD or PECVD methods, in which Si-containing gases, e.g. $SiH_4$, are decomposed in the gas phase to silicon (CVD=chemical vapor deposition, PECVD=plasma enhanced CVD).

This object is achieved in accordance with the invention by a process for reducing or eliminating the band gap shift which is to be observed in a solar cell or another photovoltaic system, the production process for this solar cell or the photovoltaic system comprising a step in which a substrate is coated with a formulation comprising at least one silicon compound, said process being characterized in that the formulation additionally comprises at least one germanium compound.

With the addition of the germanium compound to the formulation with which the substrate is coated, it is possible to produce a photovoltaic system with an improved energy yield of the incident sunlight. These include both solar cells with only one diode sequence and tandem solar cells with more than one active diode. The energy yield can therefore be improved since the great shift in band gap ("blue shift") which is to be observed when working with a formulation containing only silicon in the production of the photovoltaic system is compensated for again by addition of the germanium, such that the actually "poor" polymorphic silicon layer is "improved" again. In this way, the band gap of typically more than 1.9 eV can be adjusted again to values of, for example, 1.3 to 1.5 eV. Thus, properties of the polymorphic silicon with the optimal band gap for AM radiation, e.g. AM1 to AM1.5 radiation, are achieved again, but with the significant advantage of low layer thickness and a favorable production process.

The desired effect of the "correction" of the band gap shift can be achieved whenever the germanium together with the silicon forms a polymorphic silicon-germanium layer, the size of the band gap possibly being influenced firstly by the proportion of the germanium and secondly by the degree and/or the way in which it is distributed within the silicon. Therefore, all germanium compounds or else germanium itself are suitable in principle if an appropriate distribution of the germanium in the silicon-germanium layer can be achieved by the coating process.

In a preferred embodiment of the process according to the invention, the germanium compound is a germanium-hydrogen compound, preferably of the general formula $Ge_nH_{2n+2}$ or $Ge_nH_{2n}$ where n=1 to 10, preferably where n=4 to 8; a germanium halide; a germanium organyl; an oligomeric germanium compound $Ge_nR_{2n+2}$ or $Ge_nR_{2n}$ where n=8 to 100 and R=H, halogen, organyl, where each R may be selected independently; mixed germanium-silicon-hydrogen organyls, e.g. $RH_2GeSiH_3$, or any mixture of such germanium compounds. Particular preference is given to compounds $Ge_nH_{2n+2}$ or $Ge_nH_{2n}$ where n=4 to 8 in a mixture with oligomeric germanium compounds $Ge_nR_{2n+2}$ or $Ge_nR_{2n}$ with weight-average molecular weights of 500 to 10 000 g/mol, preferably 800 to 5000 g/mol. In addition, those mixed germanium-silicon-hydrogen organyls, for example $GeH_2PhSiH_3$, oligomers thereof, or else cooligomers thereof with silanes.

Particular preference is given to using germanium-hydrogen compounds, i.e. to germanes and oligo- or polygermanes, since they are readily available, have a high germanium content based on the molar mass of the compounds, and due to their physicochemical relationship to the silanes used with preference can be formulated readily therewith. Numerous examples of polygermanes suitable in principle can be found in WO 2007/044429 A2. Particularly suitable (oligo/poly) germanes for the process according to the invention are those of the general formula $Ge_nH_{2n+2}$ or $Ge_nH_{2n}$ where n=1 to 10, preferably n=4 to 8, since they can be prepared relatively easily from $GeH_4$ by oligomerization, by, for example, allowing $GeH_4$ to circulate through a stationary electric charge under reduced pressure (see, for example, Hollemann-Wiberg, Lehrbuch der Anorganischen Chemie [Inorganic chemistry], 101st edition, Walter de Gruyter publishers, 1995, p. 956; or E. Wiberg, E. Amberger "Hydride", Elsevier, Amsterdam 1971, p. 639-718). In addition, the germanium compounds can also be oligomerized partly or wholly by irradiation or thermal treatment, it being possible to establish molar masses of 500 g/mol to 10 000 g/mol, preferably 800 g/mol to 5000 g/mol, more preferably 1000 to 3000 g/mol.

The proportion of germanium in the silicon-containing formulation with which the substrate is coated is preferably 0.5 to 15.0 mol %, more preferably 3.0 to 12.0 mol %, most preferably 4.0 to 10.0 mol %, based on the proportion of pure silicon and germanium. It is known from the literature that the band gap in the case of addition of 18% $GeH_4$ falls in an approximately linear manner from 1.8 eV to 1.35 eV; see FIG. 2 (D. Tahir, R. A. C. M. M. van Swaaij: High Quality Hydrogenated Amorphous Silicon-Germanium Alloys for Grading Purposes at the Intrinsic Layer Tandem Solar Cells, SAFE 2001: proceedings CD-ROM (pp. 191-194), Utrecht: STW technology foundation, TUD).

The subject matter of the present invention also encompasses the abovementioned production process itself, i.e. the production process, for example, of a solar cell or another photovoltaic system, when the process comprises a step in which a substrate is coated with a formulation comprising at least one silicon compound, and the process is characterized in that the formulation additionally comprises at least one germanium compound.

A general embodiment of the process according to the invention for production of a photovoltaic system comprising at least one layer consisting predominantly of silicon, preferably for production of a solar cell, preferably comprises the steps of:

a) providing a substrate,
b) providing a formulation comprising at least one silicon compound,
c) coating the substrate with the formulation,
d) irradiating and/or thermally treating the coated substrate to form an at least partially polymorphic layer consisting predominantly of silicon, characterized in that the formulation additionally comprises at least one germanium compound, such that the layer formed comprises germanium in such a way that an at least partially polymorphic layer consisting predominantly of silicon-germanium is present.

The production of a solar cell, for example, requires at least one pn junction. This can be achieved with two layers, using one n-Si layer and one p-Si layer. To produce the n-Si and p-Si layers, dopants are used, examples being phosphorus compounds in the case of n-doping and boron compounds in the case of p-doping. As an alternative, it is possible, for example, to additionally also arrange an undoped i-Si layer in between.

As a result of the preferably used amount of 0.5 to 15.0 mol %, more preferably 3.0 to 12.0 mol %, most preferably 4.0 to 10.0 mol %, based on the proportion of pure silicon and germanium in the silicon-containing formulation used for coating, the proportion of germanium in the silicon-germanium layer is typically also within these ranges. Since, depending on the coating and/or thermal treatment conditions, and depending on the physicochemical properties of the silicon and germanium compounds used, different losses of silicon and germanium based on the amounts used can occur in the coating and thermal treatment, different mol % contents of germanium in the formulation used and the finished silicon-germanium layer can arise. The band gap shift can also be associated with the morphology, which means that different Si/Ge compositions can also affect the morphology, and so a deviation can also arise here from the purely arithmetic effect of the composition.

In a preferred embodiment of the process according to the invention, the silicon compound is a silicon-hydrogen compound, preferably of the general formula $Si_nH_{2n+2}$ where n=3 to 10, preferably n=4 to 8, or $Si_nH_{2n}$ where n=4 to 8; preferably n=5 and 6; a silicon halide; a silicon organyl; an oligomeric silicon compound $Si_nR_{2n+2}$ or $Si_nR_{2n}$ where n=8 to 100 and R=H, halogen, organyl, where each R may be selected independently; or any mixture of such silicon compounds. In addition, the compounds mentioned may be partly or wholly oligomerized, establishing molar masses of 500 g/mol to 10 000 g/mol, preferably 1000 g/mol to 5000 g/mol. In addition, the silicon compounds, like the above-described germanium compounds, can also be partly or wholly oligomerized by irradiation or thermal treatment, in which case it is possible to establish molar masses of 500 g/mol to 10 000 g/mol, preferably 800 g/mol to 5000 g/mol, more preferably 1000 g/mol to 3000 g/mol.

As in the case of the germanium compounds, particular preference is given to using silicon-hydrogen compounds, i.e. silanes and oligo- or polysilanes, since they are obtainable by chemical syntheses or catalytic fusion of $SiH_4$, have a high silicon content based on the molar mass of the compounds and can be formulated easily with the preferred germanes. Numerous examples of polysilanes suitable in principle can be found in WO 2007/044429 A2. Particularly suitable silanes for the process according to the invention are those of the general formula $Si_nH_{2n+2}$ where n=3 to 10, preferably n=4 to 8, or $Si_nH_{2n}$ where n=4 to 8, preferably n=5 and 6.

The silicon- and germanium-containing formulation used in the processes according to the invention is typically a liquid formulation. This consists of the aforementioned silicon and germanium compounds, optionally in a mixture with solvents. Suitable solvents are, for example, aliphatic or aromatic hydrocarbons liquid at room temperature, and mixtures thereof. Examples are octane, nonane, decane, toluene, xylene, mesitylene, cyclooctane. The viscosity of the coating solution is typically 200 to 2000 mPas.

In one variant of the process according to the invention, the silicon- and germanium-containing formulation can be prepared by oligomerizing and/or polymerizing a mixture comprising at least one higher silane of the general formula $Si_nH_{2n+2}$ where n=3 to 10, preferably n=4 to 8, or $Si_nH_{2n}$ where n=4 to 8, preferably n=5 and 6, and at least one higher germane of the general formula $Ge_nH_{2n+2}$ where n=3 to 10, preferably n=4 to 8, or $Ge_nH_{2n}$ where n=4 to 8, preferably n=5 and 6. For oligomerization by means of UV radiation or heat treatment, higher silanes and germanes of the aforementioned formulae where n≥3 are used. In this way, it is possible to produce, from a liquid low-viscosity mixture in one step, a desired higher-viscosity liquid mixture comprising oligo/polygermanes, oligo/polysilanes and/or corresponding copolymers/cooligomers. It is optionally possible additionally to add solvents, dopants and/or further assistants. These further agents or substances can each independently be added to the mixture before the oligomerization and/or polymerization or not until thereafter. If dopants are added to the mixtures, examples may be phosphorus compounds in the case of n-doping and boron compounds in the case of p-doping. In this case too, the oligomerization and/or polymerization can be effected partly or wholly by irradiation or thermal treatment, it being possible to establish molar masses of 500 g/mol to 10 000 g/mol, preferably 800 g/mol to 5000 g/mol, more preferably 1000 g/mol to 3000 g/mol.

In WO 2007/044429 A2, at page 13 line 14 to page 28 line 20, a large number of silicon and germanium compounds likewise usable in the processes according to the invention can be found. The compounds and mixtures described therein may be part of the formulations described here or be used directly in the form of these formulations.

The solvents, dopants and/or further assistants optionally additionally added to the silicon- and germanium-containing formulation can be added before, during and/or after the coating. The proportion of solvent based on the overall formulation may be 5 to 93% by weight, preferably 15 to 60% by weight, more preferably 25 to 45% by weight.

The substrate can be coated with the silicon- and germanium-containing formulation in a known manner. Typical methods are: casting, spin-on deposition, atomization from the liquid phase, knife-coating and roll-coating. In a preferred embodiment of the process according to the invention, the substrate is coated by means of spin-on deposition.

The irradiation and/or thermal treatment of the coated substrate can likewise be effected in a known manner. For instance, the substrate coated with the formulation is heated to temperatures of 300 to 1000° C., preferably 400 to 900° C., more preferably 500 to 800° C. According to the invention, this forms an at least partly polymorphic layer consisting predominantly of silicon-germanium. In the case of freshly produced layers, initial curing by crosslinking can also be effected with a UV lamp (e.g. wavelength 254 nm, power 15 watts or wavelength 180 nm). In a preferred embodiment of the process according to the invention, the coated substrate is sent to a thermal treatment without irradiation. Examples of useful heating units include hotplates, infrared fields, tubular furnaces or muffle furnaces, in each case with substantial exclusion of $O_2$ and $H_2O$. The temperatures range from 300° C. to 1000° C. The layers can also be aftertreated by heating under forming gas mixtures of hydrogen and nitrogen or of hydrogen and argon (e.g. $H_2/N_2$ in a volume ratio of 5/95 to 10/90 or $H_2/Ar$ in a volume ratio of 5/95 to 10/90) at temperatures of 350° C. to 800° C., preferably 400° C. to 700° C.

Useful substrates include semiconductor wafers, metals, metal alloys, graphite or other conductive carbon substrates or other conductive formulations, for example metal flakes in a carbon matrix, and conductive material-coated insulators such as glass, ceramic or thermally stable plastics. In the case of the coated insulators, it should be ensured that the later coverage of the substrate with silicon-germanium is not over the full surface, in order that a conductive connection remains at the side, for example for output conduction.

The present invention further provides a photovoltaic system, especially a solar cell or solar cell combinations, e.g. tandem cells, which has been produced or can be produced using the processes according to the invention described here.

More particularly, the present invention also encompasses the use of a germanium compound in a production process for a photovoltaic system when the process comprises a step in which a substrate is coated with a formulation comprising at least one silicon compound and the formulation additionally comprises at least one such germanium compound.

FIG. 1 shows a Tauc plot for determination of the band gap of amorphous, multicrystalline or polymorphic semiconductors. The plot is that of the square root of the product of absorption coefficient (in $cm^{-1}$) and photon energy (in eV) against the photon energy. The squares are the values measured; fitted straight lines have been placed between them. The point of intersection of the straight lines with the abscissa gives the band gap (Tauc, Grigorovici, Vancu (1966), Phys. Stat. Sol. 15, 627). The "silicon from higher silane" curve was obtained using comparative example 1.

Figure 2:
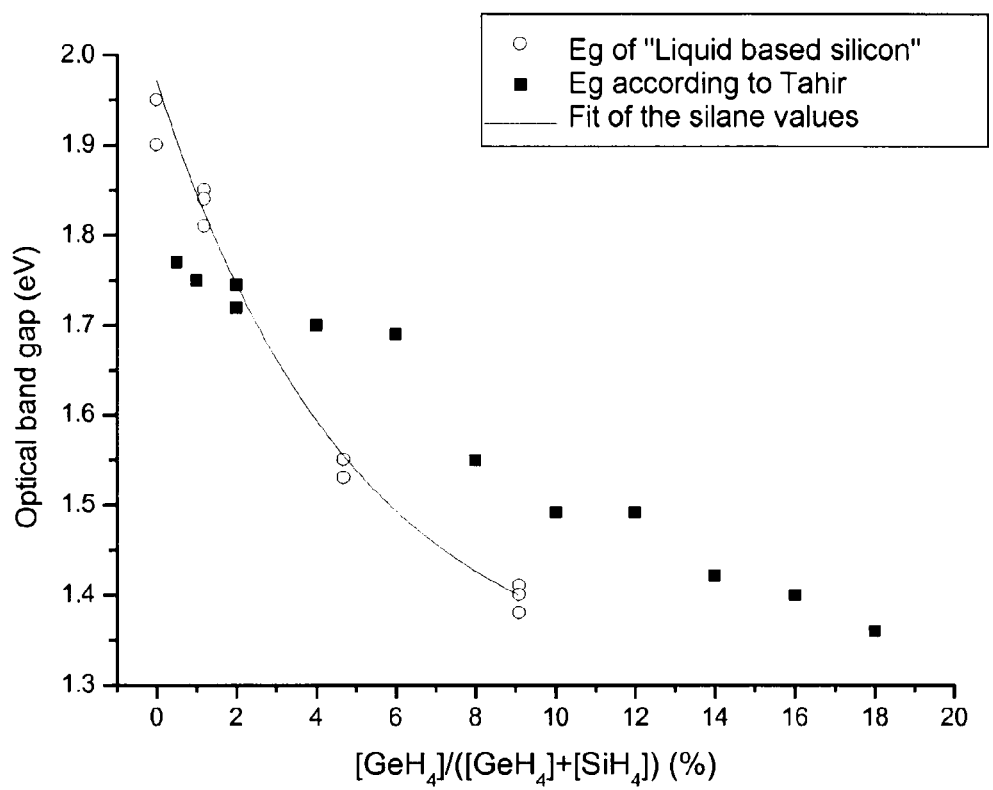

FIG. 2 shows the optical band gap as a function of Ge addition in mol %. The squares are values according to Tahir and van Swaaij (High Quality Hydrogenated Amorphous Silicon-Germanium Alloys for Grading Purposes at the Intrinsic Layer Tandem Solar Cells, SAFE 2001: proceedings CD-ROM (pp. 191-194), Utrecht: STW technology foundation, TUD); the circles are values from the claims. As a readability aid, the values from the claims were associated by means of a fitted curve.

EXAMPLES

Comparative Example 1

In an argon atmosphere with 0.5 ppm of $O_2$ and 0.5 ppm of $H_2O$ (glovebox), 10 g of cyclopentasilane are irradiated in an open vessel with a UV lamp (wavelength 254 nm, power 15 watts) at a distance of 6 cm for 15 min. This makes the mobile silane more viscous. Gel permeation chromatography (GPC) with the aid of a polystyrene calibration curve is used to determine the weight-average molecular weight of the high molecular weight component to be $M_w$=2400 g/mol. In addition, the mixture still comprises residues of monomeric cyclopentasilane. The mixture is diluted with 3 parts of toluene and applied with the aid of a spin-coater to a pre-cleaned quartz blank (3 cm*3 cm). Then a hotplate is used to heat the layer to 500° C. The result is a dark silicon layer. This layer is subsequently heated in a furnace under inert gas at 750° C. for 30 min.

The layer thickness, measured with a profilometer, KLA Tencor, P15 instrument type (KLA-Tencor Corporation, Film and Surface Technology; 160 Rio Robles, San Jose, Calif. USA 95134), is 250 nm. The conductivity of the layer, characterized as the ohmic resistance by means of measurement with a Hewlett Packard P 4156A analyzer and after conversion to ohm*cm, is greater than $10^7$ ohm*cm. The band gap measured is 1.95 eV.

Comparative Example 2

Comparative example 1 is repeated, and tri(o-tolyl)phosphorus as a dopant is added together with the toluene in the course of dilution to the mixture, prepared by UV radiation, of oligomeric cyclopentasilane with the weight-average molecular weight of the high molecular weight component of $M_w$=2400 g/mol and monomeric cyclopentasilane. The solution is again applied with the aid of a spin-coater to a pre-cleaned quartz blank (3 cm*3 cm) and the layer is heated to 500° C. with the aid of a hotplate. The result is a dark n-doped silicon layer. This layer is subsequently heated in a furnace under inert gas at 750° C. for 30 min.

The layer thickness, measured with a profilometer, KLA Tencor, P15 instrument type (KLA-Tencor Corporation, Film and Surface Technology; 160 Rio Robles, San Jose, Calif. USA 95134), is 210 nm. The conductivity of the layer, characterized as the ohmic resistance by the method explained in comparative example 1, is 40 ohm*cm. The band gap measured by the method described in comparative example 1 is 1.90 eV.

Comparative Example 3

Comparative example 1 is repeated, and decaborane-14 as a dopant is added together with the toluene in the course of dilution to the mixture, prepared by UV radiation, of oligomeric cyclopentasilane with the weight-average molecular weight of the high molecular weight component of $M_w$=2400 g/mol and monomeric cyclopentasilane. The solution is again applied with the aid of a spin-coater to a pre-cleaned quartz blank (3 cm*3 cm) and the layer is heated to 500° C. with the aid of a hotplate. The result is a dark p-doped silicon layer. This layer is subsequently heated in a furnace under inert gas at 750° C. for 30 min.

The layer thickness, measured with a profilometer, KLA Tencor, P15 instrument type (KLA-Tencor Corporation, Film and Surface Technology; 160 Rio Robles, San Jose, Calif. USA 95134), is 270 nm. The band gap measured by the method described in comparative example 1 is 1.90 eV. The conductivity of the layer, characterized as the ohmic resistance by the method explained in comparative example 1, is 15 ohm*cm.

Example 1

In an argon atmosphere with ≤0.5 ppm of $O_2$ and ≤0.5 ppm of $H_2O$ (glovebox), 10 g of cyclopentasilane and 0.76 g of $PhH_2GeSiH_3$ are irradiated in an open vessel with a UV lamp (wavelength 254 nm, power 15 watts) at a distance of 6 cm for 35 min. This makes the mixture more viscous. Gel permeation chromatography (GPC) with the aid of a polystyrene calibration curve is used to determine the weight-average molecular weight of the high molecular weight component of $M_w$=2300 g/mol. The high molecular weight component comprises oligomers of cyclopentasilane, some of them with germanium incorporated via cooligomerization. In addition, the mixture still comprises residues of monomeric cyclopentasilane and unconverted $PhH_2GeSiH_3$. The mixture is diluted with 3 parts of toluene and applied with the aid of a spin-coater to a pre-cleaned quartz blank (3 cm*3 cm). Then a hotplate is used to heat the layer to 500° C. This layer is subsequently heated in a furnace under inert gas at 750° C. for 30 min. The result is a dark silicon-germanium layer.

The layer thickness, measured with a profilometer, KLA Tencor, P15 instrument type (KLA-Tencor Corporation, Film and Surface Technology; 160 Rio Robles, San Jose, Calif. USA 95134), is 240 nm. The band gap measured by the method described in comparative example 1 is 1.85 eV. The conductivity of the layer, characterized as the ohmic resistance by the method explained in comparative example 1, is greater than $10^7$ ohm*cm.

Example 2

Example 1 is repeated, except with addition of tri(o-tolyl)phosphorus as a dopant in the step of dilution of the mixture of oligomers of cyclopentasilane; with partial germanium incorporation via cooligomerization, and monomeric cyclopentasilane and unconverted $PhH_2GeSiH_3$. A spin-coater is used to apply the solution to a pre-cleaned quartz blank (3 cm*3 cm). Then a hotplate is used to heat the layer to 500° C. The result is a dark silicon-germanium layer. This layer is subsequently heated in a furnace under inert gas at 750° C. for 30 min.

The layer thickness, measured with a profilometer, KLA Tencor, P15 instrument type (KLA-Tencor Corporation, Film and Surface Technology; 160 Rio Robles, San Jose, Calif. USA 95134), is 220 nm. The band gap measured by the method described in comparative example 1 is 1.84 eV. The conductivity of the layer, characterized as the ohmic resistance by the method explained in comparative example 1, is 36 ohm*cm.

Example 3

Example 1 is repeated, except with addition of decaborane-14 as a dopant in the step of dilution of the mixture of oligomers of cyclopentasilane, with partial germanium incorporation via cooligomerization, and monomeric cyclopentasilane and unconverted $PhH_2GeSiH_3$. A spin-coater is used to apply the solution to a pre-cleaned quartz blank (3 cm*3 cm). Then a hotplate is used to heat the layer to 500° C. This layer is subsequently heated in a furnace under inert gas at 750° C. for 30 min. The result is a dark silicon-germanium layer.

The layer thickness, measured with a profilometer, KLA Tencor, P15 instrument type (KLA-Tencor Corporation, Film and Surface Technology; 160 Rio Robles, San Jose, Calif. USA 95134), is 270 nm. The band gap measured by the method described in comparative example 1 is 1.81 eV. The conductivity of the layer, characterized as the ohmic resistance by the method explained in comparative example 1, is 17 ohm*cm.

Example 4

Example 1 is repeated, except that 10.1 g of cyclopentasilane and 3.04 g of $PhH_2GeSiH_3$ are subjected to the UV oligomerization in the first step. The mixture is diluted with 3 parts of toluene and a spin-coater is used to apply it to a pre-cleaned quartz blank (3 cm*3 cm). Then a hotplate is used to heat the layer to 500° C. The result is a dark silicon-germanium layer. This layer is subsequently heated in a furnace under inert gas at 750° C. for 30 min.

The layer thickness, measured with a profilometer, KLA Tencor, P15 instrument type (KLA-Tencor Corporation, Film and Surface Technology; 160 Rio Robles, San Jose, Calif. USA 95134), is 250 nm. The band gap measured by the method described in comparative example 1 is 1.53 eV. The conductivity of the layer, characterized as the ohmic resistance by the method explained in comparative example 1, is greater than $10^7$ ohm*cm.

Example 5

Example 4 is repeated, except that 10.1 g of cyclopentasilane and 3.04 g of $PhH_2GeSiH_3$ are again subjected to the UV oligomerization in the first step. However, when diluting, tri(o-tolyl)phosphorus is added as a dopant together with the toluene. A spin-coater is used to apply the mixture to a pre-cleaned quartz blank (3 cm*3 cm). Then a hotplate is used to heat the layer to 500° C. The result is a dark silicon-germanium layer. This layer is subsequently heated in a furnace under inert gas at 750° C. for 30 min.

The layer thickness, measured with a profilometer, KLA Tencor, P15 instrument type (KLA-Tencor Corporation, Film and Surface Technology; 160 Rio Robles, San Jose, Calif. USA 95134), is 230 nm. The band gap measured by the method described in comparative example 1 is 1.55 eV. The conductivity of the layer, characterized as the ohmic resistance by the method explained in comparative example 1, is 42 ohm*cm.

Example 6

Example 4 is repeated, except that 10.1 g of cyclopentasilane and 6.08 g of $PhH_2GeSiH_3$ are subjected again to the UV oligomerization in the first step. However, when diluting, decaborane-14 is added as a dopant together with the toluene. A spin-coater is used to apply the mixture to a pre-cleaned quartz blank (3 cm*3 cm). Then a hotplate is used to heat the layer to 500° C. The result is a dark silicon-germanium layer. This layer is subsequently heated in a furnace under inert gas at 750° C. for 30 min.

The layer thickness, measured with a profilometer, KLA Tencor, P15 instrument type (KLA-Tencor Corporation, Film and Surface Technology; 160 Rio Robles, San Jose, Calif. USA 95134), is 260 nm. The band gap measured by the method described in comparative example 1 is 1.53 eV. The conductivity of the layer, characterized as the ohmic resistance by the method explained in comparative example 1, is 12 ohm*cm.

Example 7

Example 1 is repeated, except that 10.1 g of cyclopentasilane and 6.08 g of $PhH_2GeSiH_3$ are subjected to the UV oligomerization in the first step. The mixture is diluted with 3 parts of toluene and a spin-coater is used to apply it to a pre-cleaned quartz blank (3 cm*3 cm). Then a hotplate is used to heat the layer to 500° C. The result is a dark silicon-germanium layer. This layer is subsequently heated in a furnace under inert gas at 750° C. for 30 min.

The layer thickness, measured with a profilometer, KLA Tencor, P15 instrument type (KLA-Tencor Corporation, Film and Surface Technology; 160 Rio Robles, San Jose, Calif. USA 95134), is 250 nm. The band gap measured by the method described in comparative example 1 is 1.41 eV. The conductivity of the layer, characterized as the ohmic resistance by the method explained in comparative example 1, is greater than 107 ohm*cm.

Example 8

Example 7 is repeated, except that 10.1 g of cyclopentasilane and 6.08 g of $PhH_2GeSiH_3$ are again subjected to the UV oligomerization in the first step. However, when diluting, tri(o-tolyl)phosphorus is added as a dopant together with the toluene. A spin-coater is used to apply the mixture to a pre-cleaned quartz blank (3 cm*3 cm). Then a hotplate is used to heat the layer to 500° C. The result is a dark silicon-germanium layer. This layer is subsequently heated in a furnace under inert gas at 750° C. for 30 min.

The layer thickness, measured with a profilometer, KLA Tencor, P15 instrument type (KLA-Tencor Corporation, Film and Surface Technology; 160 Rio Robles, San Jose, Calif. USA 95134), is 220 nm. The band gap measured by the method described in comparative example 1 is 1.39 eV. The conductivity of the layer, characterized as the ohmic resistance by the method explained in comparative example 1, is 33 ohm*cm.

Example 9

Example 7 is repeated, except that 10.1 g of cyclopentasilane and 6.08 g of $PhH_2GeSiH_3$ are again subjected to the UV oligomerization in the first step. However, when diluting, decaborane-14 is added as a dopant. A spin-coater is used to apply the mixture to a pre-cleaned quartz blank (3 cm*3 cm). Then a hotplate is used to heat the layer to 500° C. The result is a dark silicon-germanium layer. This layer is subsequently heated in a furnace under inert gas at 750° C. for 30 min.

The layer thickness, measured with a profilometer, KLA Tencor, P15 instrument type (KLA-Tencor Corporation, Film and Surface Technology; 160 Rio Robles, San Jose, Calif. USA 95134), is 280 nm. The band gap measured by the method described in comparative example 1 is 1.38 eV. The conductivity of the layer, characterized as the ohmic resistance by the method explained in comparative example 1, is 14 ohm*cm.

The invention claimed is:

1. A process for reducing or eliminating the band gap shift in the production of a photovoltaic system, said production process comprising:
   oligomerizing or polymerizing a mixture comprising a silane and a germanium compound to form a formulation comprising the silane, the germanium compound and a co-oligomerized product consisting of units of the silane and the germanium compound;
   coating a flat surface of a substrate with the formulation, wherein during the coating the formulation is in liquid form, to obtain a coated substrate,
   irradiating, thermally treating, or both irradiating and thermally treating the coated substrate to obtain an at least partially polymorphic layer comprising silicon and germanium on the flat surface of the substrate;
   wherein the germanium compound is of formula $Ge_nH_{2n+2}$ or $Ge_nH_{2n}$ where n is an integer from 4 to 8 and is present in the mixture with an oligomeric germanium compound of formula $Ge_nR_{2n+2}$ or $Ge_nR_{2n}$ and having weight-average molecular weight of 500 to 10,000 g/mol, wherein n is an integer from 4 to 8, R is independently H, halogen, or organyl, and at least one R is an organyl, wherein the silane is of formula (i) $Si_nH_{2n+2}$ where n is an integer from 3 to 10, (ii) $Si_nH_{2n}$ where n is an integer from 4 to 8, (iii) $Si_nR_{2n+2}$ where n is an integer from 8 to 100 and R is H or an organyl with at least one R being an organyl, or (iv) $Si_nR_2$ where n is an integer from 8 to 100 and R is H or an organyl with at least one R being an organyl.

2. The process of claim 1,
wherein a proportion of germanium in the formulation is 0.5 to 15.0 mol %, based on pure silicon and germanium.

3. The process of claim 1,
wherein a proportion of germanium in the at least partially polymorphic layer is 0.5 to 15.0 mol %, based on pure silicon and germanium.

4. The process of claim 1,
wherein the formulation has a viscosity of the formulation is 200 to 2000 mPas.

5. The process of claim 1,
wherein the formulation is prepared in a process comprising:
oligomerizing or polymerizing a mixture comprising:
at least one silane of either the general formula $Si_nH_{2n+2}$ wherein n is an integer from 3 to 10 or $Si_nH_{2n}$ wherein n is an integer from 4 to 8,
at least one germane of either the general formula $Ge_nH_{2n+2}$ wherein n is an integer from 3 to 10 or $Ge_nH_{2n}$ wherein n is an integer from 4 to 8, and
optionally further comprises solvents, dopants further assistants, or a combination thereof.

6. The process of claim 1, further comprising
adding solvents, dopants, further assistants, or a combination thereof to the formulation
wherein the adding is before the coating, during the coating, after the coating, or a combination thereof.

7. The process of claim 1,
wherein the coating comprises spin-on deposition, casting, atomization from a liquid phase, knife-coating, or roll-coating.

8. The process of claim 1, comprising:
irradiation or thermal treatment at temperatures of from 300 to 1000° C.

9. The process of claim 1, wherein the silicon compound is of a general formula $Si_nH_{2n+2}$ and n is an integer from 3 to 10.

10. The process of claim 1, wherein the silicon compound is of a general formula $Si_nH_{2n}$ and n is an integer from 4 to 8.

11. A process for producing a photovoltaic system comprising at least one layer consisting essentially of silicon-germanium, said production process comprising:
oligomerizing or polymerizing a mixture comprising a silane and a germanium compound to form a formulation comprising the silane, the germanium compound and a co-oligomerized product consisting of units of the silane and the germanium compound;
coating a flat surface of a substrate with the formulation, wherein during the coating the formulation is in liquid form, to obtain a coated substrate,
irradiating, thermally treating, or both irradiating and thermally treating the coated substrate to obtain an at least partially polymorphic layer comprising silicon and germanium on the flat surface of the substrate;
wherein the germanium compound is of formula $Ge_nH_{2n+2}$ or $Ge_nH_{2n}$ where n is an integer from 4 to 8 and is present in the mixture with an oligomeric germanium compound of formula $Ge_nR_{2n+2}$ or $Ge_nR_{2n}$ and having weight-average molecular weight of 500 to 10,000 g/mol, wherein n is an integer from 4 to 8, R is independently H, halogen, or organyl, and at least one R is an organyl,
wherein the silane is of formula (i) $Si_nH_{2n+2}$ where n is an integer from 3 to 10, (ii) $Si_nH_{2n}$ where n is an integer from 4 to 8, (iii) $Si_nR_{2n+2}$ where n is an integer from 8 to 100 and R is H or an organyl with at least one R being organyl, or (iv) $Si_nR_2$ where n is an integer from 8 to 100 and R is H or an organyl with at least one R being an organyl.

12. The process of claim 11,
wherein a proportion of germanium in the formulation is 0.5 to 15.0 mol %, based on pure silicon and germanium.

13. The process of claim 12,
wherein a proportion of germanium in the at least partially polymorphic layer is 0.5 to 15.0 mol %, based on pure silicon and germanium.

14. The process of claim 11,
wherein the formulation has a viscosity of the formulation is 200 to 2000 mPas.

15. The process of claim 11,
wherein the formulation is prepared in a process comprising:
oligomerizing or polymerizing a mixture comprising:
at least one silane of either the general formula $Si_nH_{2n+2}$ wherein n is an integer from 3 to 10 or $Si_nH_{2n}$ wherein n is an integer from 4 to 8,
at least one germane of either the general formula $Ge_nH_{2n+2}$ wherein n is an integer from 3 to 10 or $Ge_nH_{2n}$ wherein n is an integer from 4 to 8, and
optionally further comprises solvents, dopants further assistants, or a combination thereof.

16. The process of claim 11, further comprising
adding solvents, dopants, further assistants, or a combination thereof to the formulation
wherein the adding is before the coating, during the coating, after the coating, or a combination thereof.

17. The process of claim 11,
wherein the coating comprises spin-on deposition, casting, atomization from a liquid phase, knife-coating, or roll-coating.

18. The process of claim 11, comprising:
irradiation or thermal treatment at temperatures of from 300 to 1000° C.

19. A photovoltaic system obtained by a process comprising the process of claim 11.

20. The process of claim 15, wherein the silicon compound is of a general formula $Si_nH_{2n+2}$ and n is an integer from 3 to 10.

21. The process of claim 15, wherein the silicon compound is of a general formula $Si_nH_{2n}$ and n is an integer from 4 to 8.

22. The process of claim 11, wherein the photovoltaic system is a solar cell.

* * * * *